(12) United States Patent
David

(10) Patent No.: US 8,208,379 B2
(45) Date of Patent: Jun. 26, 2012

(54) METHOD OF ACKNOWLEDGING DATA

(75) Inventor: Philip Hole David, Southampton (GB)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 225 days.

(21) Appl. No.: 12/311,602

(22) PCT Filed: Oct. 3, 2007

(86) PCT No.: PCT/GB2007/050609
§ 371 (c)(1),
(2), (4) Date: Feb. 24, 2010

(87) PCT Pub. No.: WO2008/041033
PCT Pub. Date: Apr. 10, 2008

(65) Prior Publication Data
US 2010/0182958 A1    Jul. 22, 2010

(30) Foreign Application Priority Data

Oct. 6, 2006   (GB) .................................. 0619769.3
Aug. 23, 2007  (GB) .................................. 0716435.3

(51) Int. Cl.
*H04L 12/26*   (2006.01)
(52) U.S. Cl. ...................................... 370/235
(58) Field of Classification Search ........... 370/229–237
See application file for complete search history.

(56) References Cited

U.S. PATENT DOCUMENTS

| 4,841,526 | A  | * | 6/1989  | Wilson et al. ............... 714/748 |
| 2004/0223507 | A1 | * | 11/2004 | Kuchibhotla et al. ......... 370/428 |
| 2005/0163046 | A1 |   | 7/2005  | Koponen et al. |
| 2006/0092871 | A1 |   | 5/2006  | Nishibayashi et al. |
| 2006/0282739 | A1 | * | 12/2006 | Meyer et al. ............... 714/748 |
| 2008/0056303 | A1 | * | 3/2008  | Sebire et al. ............... 370/474 |

FOREIGN PATENT DOCUMENTS

| EP | 1 626 519 A2 | 2/2006 |
| WO | 03/019852 A1 | 3/2003 |
| WO | 2005/107127 A1 | 11/2005 |

OTHER PUBLICATIONS

K. Balachandran et al.; "Efficient Transmission of ARQ Feedback for EGPRS Radio Link Control"; 50th IEEE Vehicular Technology Conference, VTC 1999—Fall; Sep. 1999; vol. 3, pp. 1663-1669.
International Search Report for Application No. PCT/GB2007/050609; mailed Feb. 7, 2008.

* cited by examiner

*Primary Examiner* — Andrew Lai
*Assistant Examiner* — Juvena Loo
(74) *Attorney, Agent, or Firm* — Staas & Halsey LLP

(57) ABSTRACT

Data in a communications system including more than one higher layer data block within a lower layer protocol block is acknowledged by sending acknowledgement data and higher layer data in the same lower layer protocol block. Acknowledgement data, relating to all the higher layer data blocks in the or each lower layer protocol block, is coded according to the probability of an acknowledgement type.

15 Claims, 2 Drawing Sheets

METHOD OF ACKNOWLEDGING DATA

CROSS REFERENCE TO RELATED APPLICATIONS

This application is the U.S. national stage of International Application No. PCT/GB2007/050609 filed Oct. 3, 2007 and claims the benefit thereof. The International Application claims the benefits of United Kingdom Application No. 0619769.3 filed on Oct. 6, 2006 and United Kingdom Application No. 0716435.3 filed on Aug. 23, 2007. All three applications are incorporated by reference herein in their entirety.

BACKGROUND

Described below is a method of acknowledging data in a communications system.

General Packet Radio Service (GPRS) data is transmitted in radio link control (RLC)/medium access control (MAC) blocks. These higher layer data blocks are coded and transmitted in lower layer protocol blocks, known as radio blocks. Depending on the coding scheme, there are typically one or two RLC/MAC blocks per radio block. A radio block typically includes one header and one or two RLC/MAC blocks. Decoding of the header is a pre-requisite for decoding the RLC/MAC block(s).

In the 3rd Generation Partnership Project (3GPP) General Packet Radio Service (GPRS)/Enhanced Data for global system for mobile communication (GSM) Evolution (EDGE) Radio Access Network (GERAN) there is work in progress to introduce 'Fast Ack/Nack Reports' (FANR). Acknowledgement of received data has been known by a specific message, such as Packet Downlink Ack/Nack, which contains acknowledgement data and possibly other control data, but does not contain any user data.

The idea of FANR is to include a small amount of acknowledgement data together with user data within the same radio block. The benefit of this is that these blocks can be sent more frequently, allowing the peer device to re-send, more quickly, blocks which were not received correctly. If existing messages were sent with a higher frequency, there would be a significant decrease in the capacity to send user data, and there would be significant redundancy in the acknowledgement messages.

SUMMARY

In accordance with a first aspect, a method of acknowledging data in a communications system having more than one higher layer data block within a lower layer protocol block includes sending acknowledgement data and higher layer data in the same lower layer protocol block; wherein acknowledgement data, relating to all the higher layer data blocks in the or each lower layer protocol block, is coded according to the probability of an acknowledgement type.

Although it is known to have one or two higher layer blocks in a lower layer block, it is possible that a greater number of higher layer blocks might be included, typically three or four.

Each set of higher layer data blocks in the lower layer protocol block being acknowledged may be allocated a variable length block in an acknowledgment report ; the relative position of the variable length block in the acknowledgement report being related to elapsed time since the higher layer data block was sent.

The acknowledgement report may include a plurality of variable length blocks, each variable length block being encoded according to a variable length code related to the probability of the acknowledgment type.

A variable length code may be used only when the maximum number of higher layer data blocks per lower layer protocol block is equal to 2.

The acknowledgement report may include an indication of the maximum number of higher layer data blocks per lower layer protocol block of all reported lower layer protocol blocks and whether a variable length code is being used.

The variable length code may further include a prefix valid only for the first code.

The variable length code may further include an end sequence indicating to legacy devices the end of the variable length code.

The variable length code may be selected from a number of stored codes.

The identity of the selected code may be included in the acknowledgement report.

A single specific bit in an acknowledgment report may relate to a specific higher layer data block.

Higher layer data blocks may be allocated to sub-groups in a predetermined manner and the variable length code is applied to each sub-group.

Various different mechanisms can be used for coding the variable length blocks in the acknowledgement report. In one embodiment, failing to receive all higher layer data blocks in a lower layer protocol block is indicated by a shorter code than that used for failing to receive only some of the higher layer data blocks.

This assumes that if all sets of higher layer data blocks fail, the system will resend them all, whereas if only some fail, it may need further detail in the coding to know which to send.

Alternatively, in another embodiment failing to receive all sets of higher layer data blocks in a lower layer data block may equally well be indicated by a longer code.

The higher layer data block may be a radio link control medium access control protocol data unit.

The system may be a general packet radio service enhanced data rates for global system for mobile communication evolution radio access network (GERAN).

In one embodiment, a single bit code indicates successful receipt of all of the higher layer data blocks in one radio block.

This assumes that successful receipt is the most common situation. However, in circumstances where this was not the case, then a single bit code may be used to indicate some other result. Where it is necessary to provide additional information as well as indication of successful receipt, the code may be the shortest code, rather than a single bit code.

BRIEF DESCRIPTION OF THE DRAWINGS

These and other aspects and advantages of a method of acknowledging data in a communications system will become more apparent and more readily appreciated from the following description of the exemplary embodiments, taken in conjunction with the accompanying drawings of which.

DETAILED DESCRIPTION OF THE PREFERRED EMBODIMENT

Figure 1:
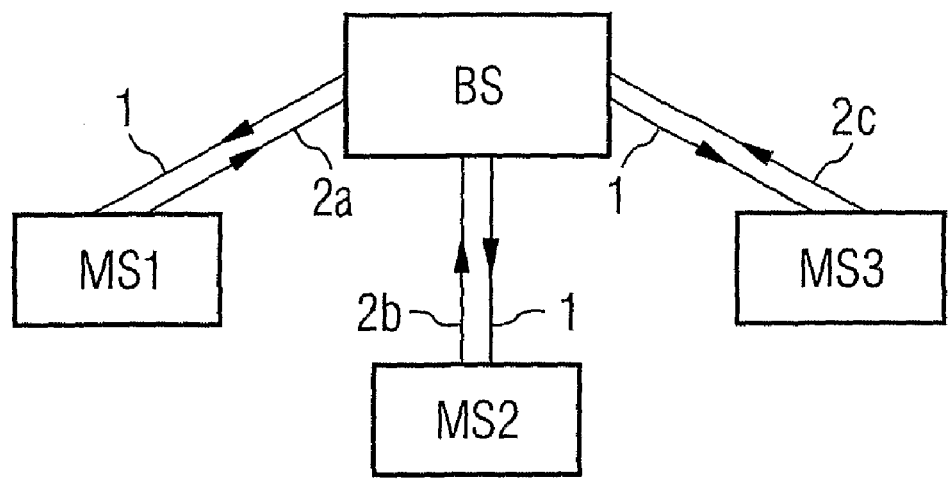
FIG. 1 is a block diagram that illustrates an example of a system in which the method is carried out.

Reference will now be made in detail to the preferred embodiments, examples of which are illustrated in the accompanying drawings, wherein like reference numerals refer to like elements throughout.

Figure 2:
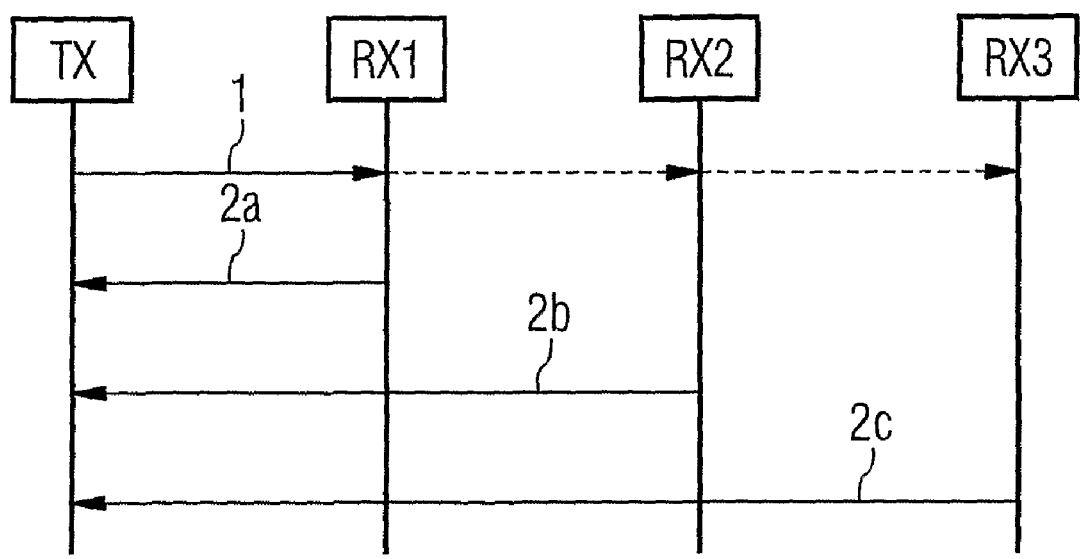
FIG. 2 is a message timing diagram that illustrates message exchange between components of the system of FIG. 1.

In the example of FIG. 1, a base station (BS) of a network communicates with one or more mobile devices (MS1, MS2, MS3). When the base station, or mobile device transmit 1, 2 to one another, they require an indication of whether the content of the transmission was safely received, or if any part needs to be resent. In known methods, this acknowledgment was a separate message. For example, as illustrated in FIG. 2, if the basestation (BS) transmits 1 to all three mobile devices, then it receives back three responses 2a, 2b, 2c if all three devices receive successfully.

The development of Fast ACK/NACK report (FANR) to address this overhead has given rise to further questions. One option is that the Fast ACK/NACK report will contain approximately 20 bits of acknowledgement data, of which 2 bits are used to indicate the status of each previously received radio block. Furthermore, there may be two RLC/MAC blocks per radio block and the coding may be, for example, as follows:

```
00  failed header decoding
    header correctly received but failed decoding of the payload of
    the RLC block (or blocks, there are more than one RLC block per
    radio block)
01  header correctly received, failed decoding of the first RLC data
    block, correct decoding of the second RLC data block
10  header correctly received, correct decoding of the first RLC data
    block, failed decoding of the second RLC data block
11  correct decoding of the payload of the (single) RLC block, or
    correct decoding of both the first and second RLC data blocks
```

However, a number of issues remain, specifically how fast the FANR reports should be sent by each peer, and how many blocks can be reported per FANR report.

Other acknowledgement data, such as sent in the Packet Downlink ACK/NACK, is sent either as an unencoded bitmap, with one bit per RLC/MAC block, or by using a variable run-length encoded version of the bitmap. However, due to the small length of the bitmap, around 20 bits, such encoding is not as efficient in this case.

In one scheme for the FANR, as described above, the identity of the blocks which are referred to is "time-based" e.g. the last block in the report is the one that was sent 40 ms ago in the opposite direction, on the corresponding timeslot as the FANR. Each codepoint in this solution refers to a radio block, not an RLC/MAC block.

An alternative solution is to have a bitmap with one bit per RLC/MAC block, plus the sequence number (SN) of the first block in the bitmap. All blocks up to the one before the first block in the bitmap are implicitly acknowledged as having been received correctly. On the one hand, this means that FANRs do not have to be sent so often, for example, in good radio conditions—if a long string of okay blocks is received, there is no need to send a FANR. Only when there is an error, must a FANR be sent. On the other hand, the SN (which may be 11 bits long) takes up a significant fraction of the FANR, reducing the amount of bitmap space available.

A further advantage of the first scheme is that, in the downlink, i.e. acknowledging data sent from the mobile to the network, the FANR can be broadcast, and refer to blocks received from multiple different packet 'connections' (known as temporary block flows-TBFs) and even from different mobiles. This is not possible with the SN-based approach, since the SN is specified on a per-TBF basis, and so a FANR could refer only to a single TBF. However, a benefit of the SN-based approach is that the SN need not be sent until an error occurs, since the SN-based FANR implicitly acknowledges blocks with lower SNs than that indicated in the FANR.

A further advantage of the first scheme is that the FANR can immediately indicate the fact that the header of a received block could not be decoded. In contrast, the SN-based approach requires the knowledge of the sequence number (which is encoded within the header) of the block in question. The identity of the block for which the header could not be decoded may be inferred from the reception of a subsequent block, but since this requires the reception of the subsequent block, this introduces a delay in indicating the failed header relative to the time-based FANR approach.

Figure 3:
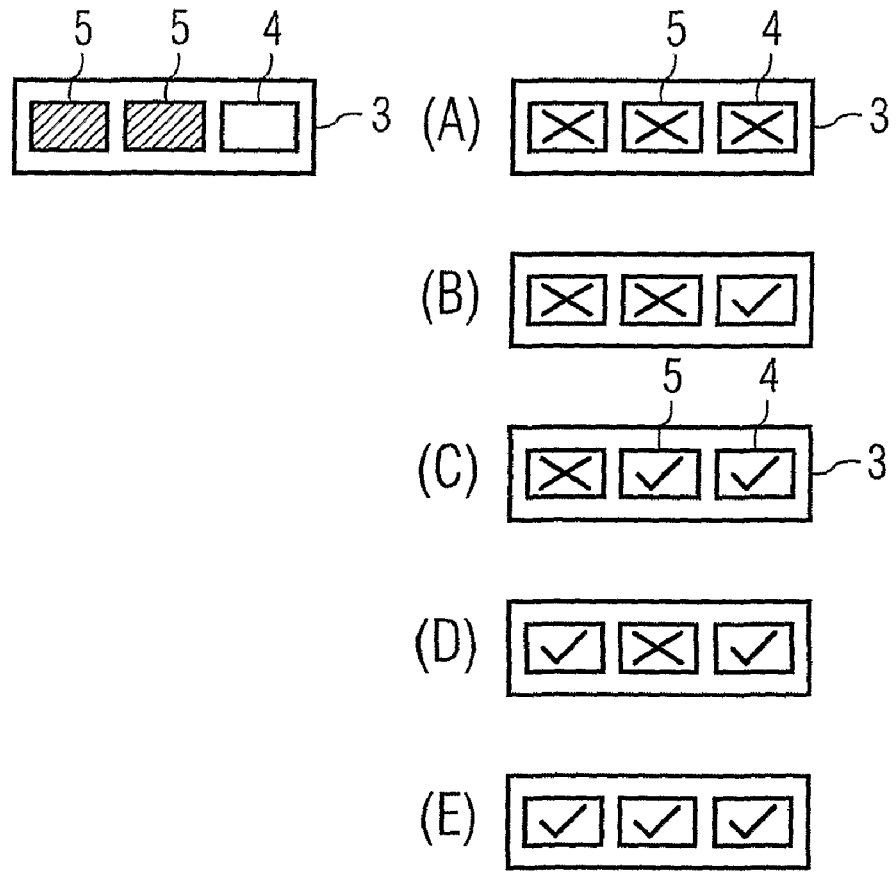
FIG. 3 is a message block layout diagram that shows an example of a radio block and possible receipt options; and, FIG. 4 is a message block layout diagram that shows acknowledgment reporting using the method for current and legacy devices.

FIG. 3 illustrates a typical set of transmission and reception blocks. An RLC/MAC block 3 is sent in one radio block period and contains an RLC/MAC header 4 and at one or more (in this case, two) RLC/MAC protocol data units (PDU) 5. There are various possible outcomes. If no header is received (option A), or if a header is received, but no PDUs (option B), the effect is the same. Alternatively, one PDU and a header may be received (options C and D), or both or all PDUs and the header are received (option E).

The 'time-based' approach can be enhanced, making it much more efficient, by using a variable-length code to define each code-point. Where previously 2 bits per radio block were required, typically, the method is able to reduce this to less than 1.5 (depending on the particular pattern of errors).

In normal operation, the probability of an RLC/MAC block being in error should be less than 30%. Therefore, since the most likely outcome is that all RLC/MAC block(s) within a radio block is/are received correctly, a single bit is used to indicate this. Longer codes are used for the other corresponding situations.

The method also makes use of the fact that, in the case where there are two data blocks per radio block, the probability of error for each of them may be highly correlated (i.e. if one is in error, it is probable that the other is also in error). Therefore, a shorter code is assigned to the case where both are in error than to the case where just one is in error. (This code is also used when a single block is carrier per radio block and is in error). Since no codepoint begins with the same sequence of bits as another shorter codepoint, there is no ambiguity in decoding.

Decoding of the payload is dependent on decoding the header correctly, so an indication of successful decoding of the one or more RLC blocks provides implicit indication that the header was decoded successfully. It is not necessary to distinguish the case where the header is not decoded successfully from the case where the header is decoded but none of the RLC data blocks could be decoded. Referring back to FIG. 3, option E where the header is decoded and (both) block(s) decoded successfully is coded as 0; option B, where the header is decoded but (both) block(s) are in error is coded as 10; option D, where the header is decoded and the first RLC/MAC block is decoded successfully, but the second is in error, is coded as 110; and option C, where the header is decoded and the first RLC/MAC block is decoded in error, but the second decoded successfully is coded as 111.

Future use of this FANR for other purposes, or in a new format, is catered for by allowing longer code points, by leaving one 'prefix' unused. An example of a solution for this is:

0 Header decoded and (both) block(s) decoded successfully (option E)
10 Header decoded but (both) block(s) in error (option B)
110 Header decoded, first RLC/MAC block decoded successfully, second in error (option D)
1110 Header decoded, first RLC/MAC block decoded in error, second successfully (option C)
1111 . . . Prefix remains unused and available for future use.

Since the probability of the "Header decoded, first RLC/MAC block decoded in error, second successfully" case is expected to be low (say 1%), the increase in the average bits used per codepoint is not significant.

However, it can be mitigated by a further refinement, whereby the 'future use' prefix is used only for the first codepoint in the FANR, with subsequent codepoints reverting to the first, non-extendable, option. Alternatively, an 'end sequence' is specified in order to permit 'legacy' devices to determine where the end of the new codepoint comes.(This end sequence cannot appear in the middle of any new codepoints, only at the end). If used to acknowledge downlink data, the '0' point also needs to cover the case where the header was decoded, but the data was not intended for that mobile.

Assuming the first, non-extendable, option is used, then if the probabilities of each event are as follows:
80% Header decoded and (both) block(s) decoded successfully (option E)
20% Header decoded but (both) block(s) in error (option B)
5% Header decoded, first RLC/MAC block decoded successfully, second in error (option D)
5% Header decoded, first RLC/MAC block decoded in error, second successfully (option C) then the average bits per radio block are 1.5 bits per radio block (0.75 per RLC/MAC block if 2 RLC/MAC blocks are sent in each radio block), compared to 2 bits per radio block (1 bit per RLC/MAC block) using the current scheme.

The above probabilities are near the end of the normal operating range (the overall probability of RLC/MAC block error here is 25%—usually this is around 10%, though can go as high as 30%). In better radio conditions, the improvement would be even greater, so for example, with the following probabilities (overall 7.5% block error probability):
90% Header decoded and (both) block(s) decoded successfully
5% Header decoded but (both) block(s) in error
2.5% Header decoded, first RLC/MAC block decoded successfully, second in error
2.5% Header decoded, first RLC/MAC block decoded in error, second successfully then only 1.15 bits per radio block are used.

The benefit of a more efficient coding is that FANRs can be sent less frequently, reducing the overhead resulting in their use. A higher overhead means either less data is sent, or that the data is encoded less strongly, making it less likely to be received correctly.

The difference between using the extendable and non-extendable versions is not very large: for the two probability scenarios shown, the extendable versions use an average of 1.55 or 1.175 bits per radio block respectively.

Depending on the range of error patterns being reported, there may be stored different variable length codes, the selection of which is made as part of the construction of the report, and the identity of the code indicated within the report.

Figure 4:
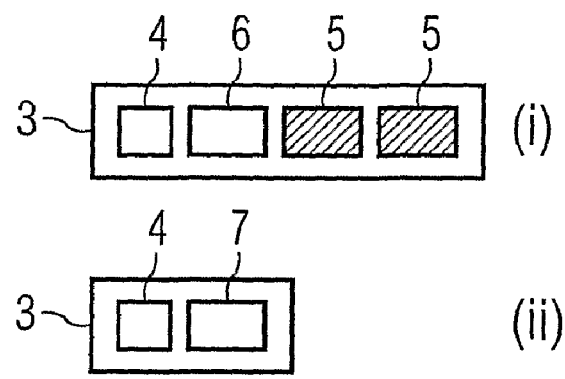

FIG. 4a shows the content of RLC/MAC block 3 when using fast ack/nack reporting. As well as the header 4, an acknowledgment data block 6 is included before the PDUs 5. By contrast in a legacy system, as shown in FIG. 4b, the RLC/MAC block includes a header and a control block which contains the acknowledgment data, but does not include PDUs.

Depending on the number of RLC/MAC blocks sent in each of the radio blocks being reported it may be beneficial (i.e. allow more efficient coding) to revert to an approach of n bits per radio block, where n is the maximum number of RLC/MAC blocks per radio block of all the radio blocks being reported, and there is a direct one-to-one mapping between bits in the report and specific RLC/MAC blocks. A further feature of this method is thus to signal within the report which type of coding is being used (i.e. the value of n and/or whether variable length coding is used or not). A further possibility is that the use (or not) of variable length coding is associated directly with the value n e.g. variable length coding is used always (and only) for n=2.

Alternatively, it might be more efficient to use the approach described above for two RLC blocks per radio block and, where there are more than two RLC blocks per radio block, to group the RLC blocks into two sub-groups in a pre-specified manner. The coding described above can then be used without modification, except that where reference is made to e.g. the 'first RLC block' being received correctly this would now mean 'all of the RLC blocks within the first sub-group' being received correctly. i.e. a positive acknowledgement indicates that all RLC blocks within a sub-group are received correctly; a negative acknowledgement indicates that one or more RLC blocks within a sub-group was not received correctly.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method of acknowledging data in a communications system, the data including more than one higher layer data block within a lower layer protocol block, the method comprising:
    obtaining acknowledgement data relating to all higher layer data blocks in each lower layer protocol block coded according to a probability of an acknowledgement type; and
    sending the acknowledgement data and higher layer data in one lower layer protocol block.

2. A method according to claim 1, further comprising allocating each set of higher layer data blocks in the lower layer protocol block being acknowledged to a variable length block in an acknowledgment report; with a relative position of the variable length block in the acknowledgement report being related to elapsed time since the higher layer data block was sent.

3. A method according to claim 2,
    wherein the acknowledgement report includes a plurality of variable length blocks, and wherein said method further comprises encoding each variable length block according to a variable length code related to the probability of the acknowledgment type.

4. A method according to claim 3, wherein a variable length code is used only when a maximum number of the higher layer data blocks per each lower layer protocol block is equal to 2.

5. A method according to claim 4, further comprising including in the acknowledgement report an indication of the maximum number of higher layer data blocks per lower layer protocol block of all reported lower layer protocol blocks and whether a variable length code is being used.

6. A method according to claim 5, wherein the variable length code further includes a prefix valid only for a first code.

7. A method according to claim 6, wherein the variable length code further comprises an end sequence indicating to legacy devices an end of the variable length code.

8. A method according to claim 7, further comprising selecting the variable length code from a number of stored codes.

9. A method according to claim 8, wherein an identity of the selected code is included in the acknowledgement report.

10. A method according to claim 9, wherein a single specific bit in an acknowledgment report relates to a specific higher layer data block.

11. A method according to claim 9, wherein said allocating allocates the higher layer data blocks to sub-groups in a predetermined manner and the variable length code is applied to each sub-group.

12. A method according to claim 11, further comprising indicating a failure to receive all sets of higher layer data blocks in a lower layer protocol block by a shorter code than that used for failing to receive only some of the higher layer data blocks.

13. A method according to claim 12, wherein the higher layer data blocks are radio link control medium access control protocol data units.

14. A method according to claim 13, wherein the system is a general packet radio service enhanced data rates for global system for mobile communication evolution radio access network.

15. A method according to claim 14, wherein a single bit code indicates successful receipt of all of the higher layer data blocks in one radio block.

* * * * *